United States Patent [19]

Farkas

[11] Patent Number: 4,749,950
[45] Date of Patent: Jun. 7, 1988

[54] BINARY POWER MULTIPLIER FOR ELECTROMAGNETIC ENERGY

[76] Inventor: Zoltan D. Farkas, 203 Leland Ave., Menlo Park, Calif. 94025

[21] Appl. No.: 839,851

[22] Filed: Mar. 14, 1986

[51] Int. Cl.$^4$ .............................................. H03K 3/01
[52] U.S. Cl. ...................................... 328/65; 307/264; 307/266; 333/20
[58] Field of Search ..................... 333/20, 109; 328/34, 328/55, 56, 65, 31, 53; 307/264, 266, 529

[56] References Cited

U.S. PATENT DOCUMENTS

| | | | |
|---|---|---|---|
| 3,573,651 | 4/1971 | Engelbrecht | 333/109 X |
| 4,009,444 | 2/1977 | Farkas et al. | 328/53 |
| 4,016,503 | 4/1977 | Rambo | 333/109 X |
| 4,384,291 | 5/1983 | Lewis | 342/196 |

OTHER PUBLICATIONS

Farkas, "A New Pulse Compression Method to Increase SLAC Energy", SLAC/AP-17 (Apr. 1984).
Farkas, "System for Savings 6 MW of Slac RF System Line Power", Single Pass Collider Memo CN-238 (Jul. 1983).

*Primary Examiner*—Eugene R. LaRoche
*Assistant Examiner*—Seung Ham
*Attorney, Agent, or Firm*—Townsend & Townsend

[57] ABSTRACT

A technique for converting electromagnetic pulses to higher power amplitude and shorter duration, in binary multiples, splits an input pulse into two channels, and subjects the pulses in the two channels to a number of binary pulse compression operations. Each pulse compression operation entails combining the pulses in both input channels and selectively steering the combined power to one output channel during the leading half of the pulses and to the other output channel during the trailing half of the pulses, and then delaying the pulse in the first output channel by an amount equal to half the initial pulse duration. Apparatus for carrying out each of the binary multiplication operation preferably includes a four-port coupler (such as a 3 dB hybrid), which operates on power inputs at a pair of input ports by directing the combined power to either of a pair of output ports, depending on the relative phase of the inputs. Therefore, by appropriately phase coding the pulses prior to any of the pulse compression stages, the entire pulse compression (with associated binary power multiplication) can be carried out solely with passive elements.

7 Claims, 5 Drawing Sheets

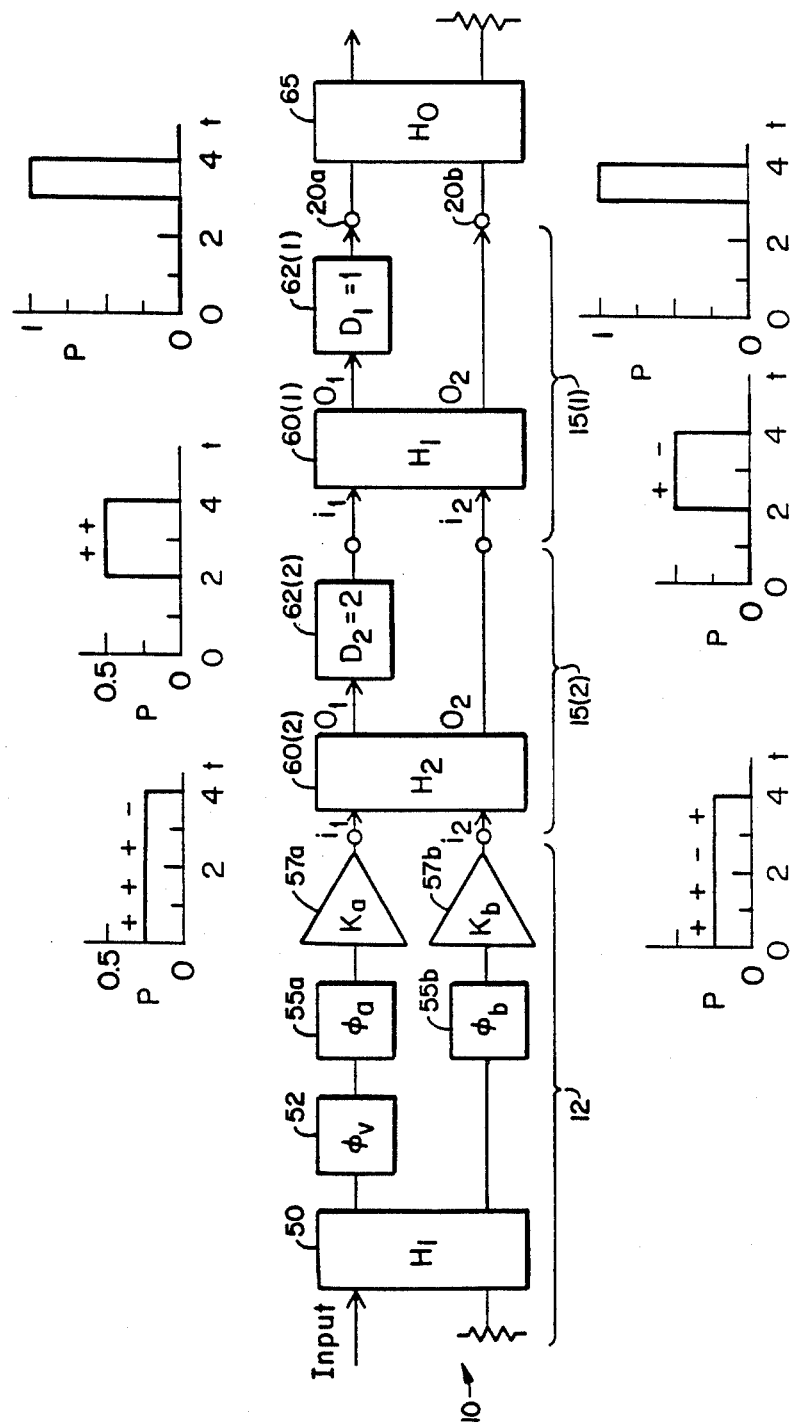
FIG._1.

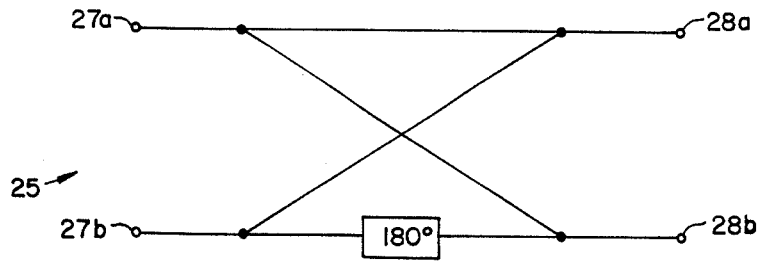
FIG._2A.
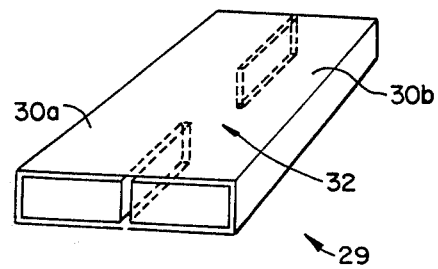
FIG._2B.
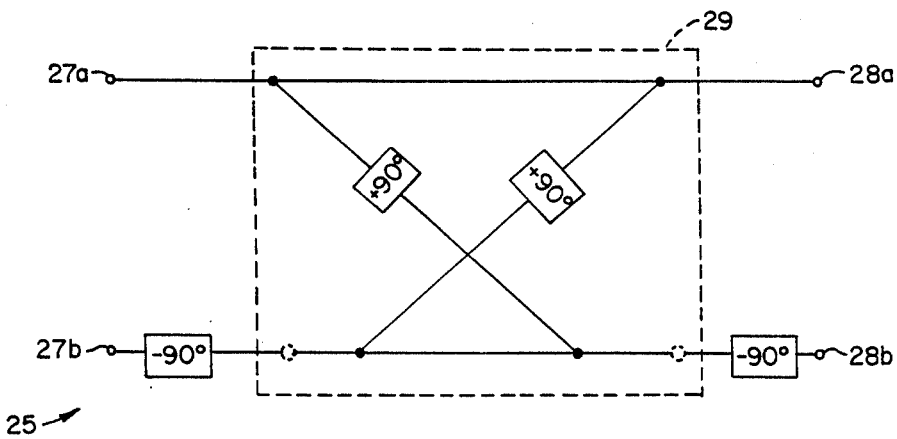
FIG._2C.

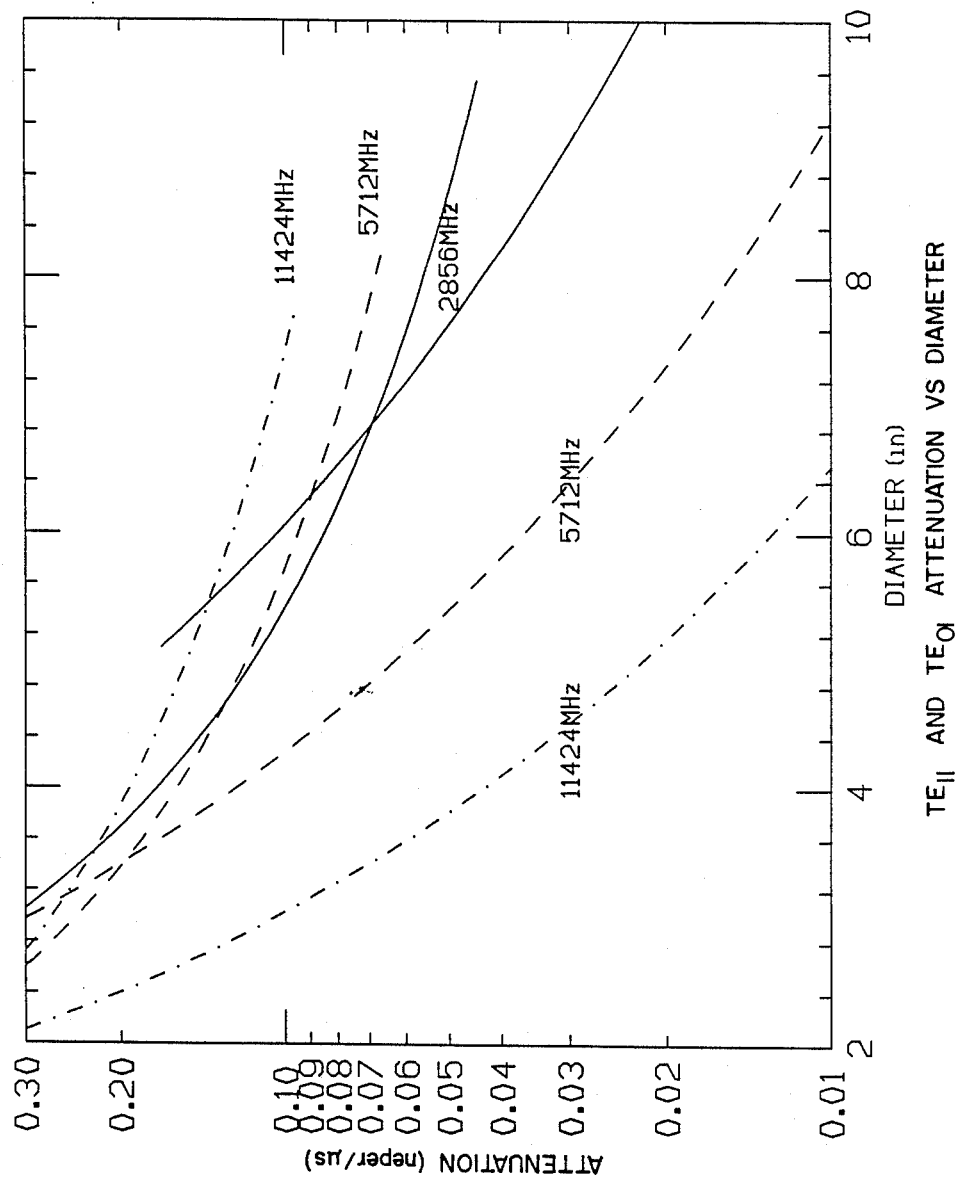
FIG._3.

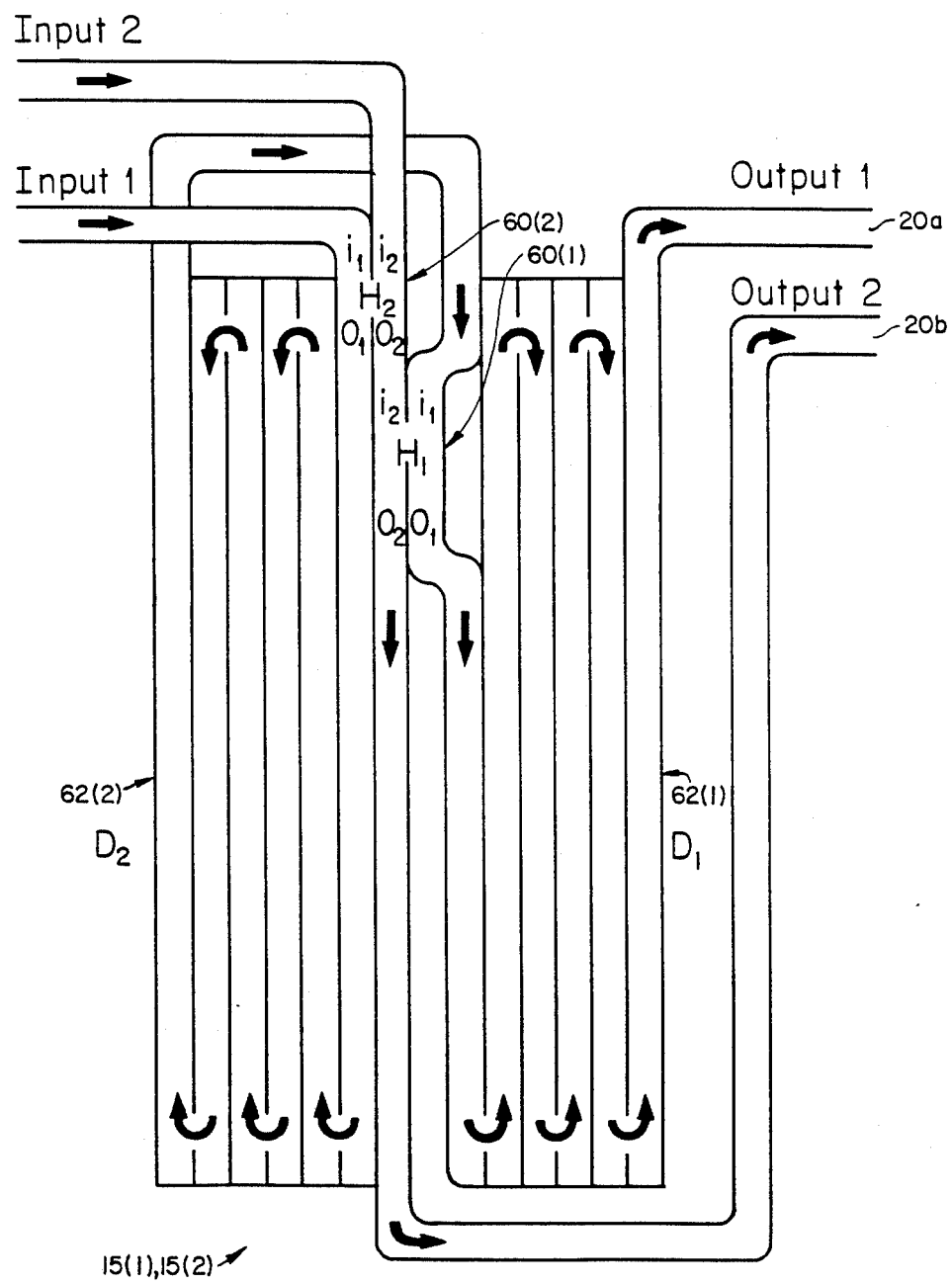
FIG._4.

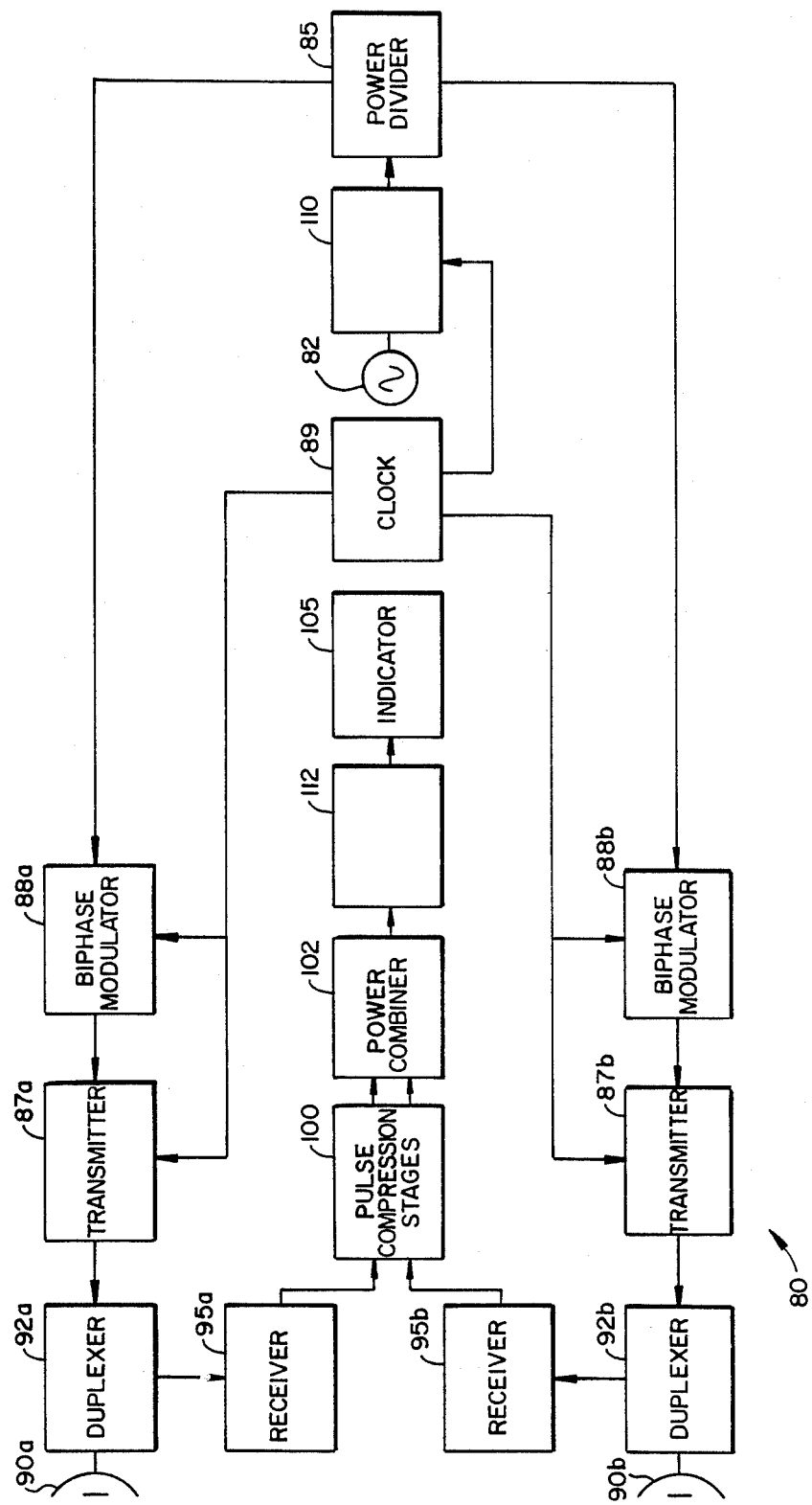
FIG._5.

BINARY POWER MULTIPLIER FOR ELECTROMAGNETIC ENERGY

The invention described herein may be manufactured and used by or for the U.S. Government for governmental purposes on a royalty-free basis.

FIELD OF THE INVENTION

The present invention relates generally to electromagnetic pulse compression techniques, and more specifically to a method and apparatus for operating on electromagnetic pulses, typically in the microwave frequency range, to increase the peak power amplitude and decrease the duration by powers of two.

BACKGROUND OF THE INVENTION

Charged particle accelerators, radar, and communications systems are but a few of the many applications that require electromagnetic ("EM") energy characterized by high peak power. For example, in a particle accelerator, the voltage per unit length gained by a charged particle traversing an accelerator section varies as the square root of the peak power. Thus a high peak power results in high particle voltages for relatively short distances. This is especially desirable for medical and industrial accelerators such as those used for sterilizing hospital equipment and for food processing. Applications such as flash radiography require bursts of short pulses (100 ns pulses separated by a fraction of a microsecond).

One prior art technique for achieving high peak power is known as the chirp method of pulse compression. In the chirp method, the frequency of the EM energy is modulated monotonically, the frequency modulated pulse is propagated through a dispersive element, and the propagated pulse is subjected to frequency demodulation. The later portions of the pulse travel faster and in effect catch up with the earlier portions. The method has the disadvantage of requiring a dispersive element, and further suffers from the problem of residual frequency modulation.

U.S. Pat. No. 4,467,284 to Farkas shows a technique for converting continuous electromagnetic energy to periodic high amplitude pulses. The technique is effective, but requires continuous electromagnetic energy storage and a finite length of time to reach steady state, rendering it unsuitable for pulse inputs. Moreover, the system includes active control elements that are required to operate at high power levels, which can be a problem. Since the peak power limits of active devices are typically lower than those of passive devices, the active control elements themselves operate to place an upper limit on the peak powers that are attainable by such systems.

U.S. Pat. No. 4,009,444 to Farkas et al. discloses a passive radio frequency peak power multiplier. The device is effective, but because of reflections, the efficiency is limited to a maximum of 81%. Furthermore, that maximum efficiency can only be obtained at a compression ratio of about 3:1, and drops off sharply as the compression ratio deviates from 3:1. Moreover, the compressed pulse power varies with time, which reduces the efficiency when the compressed pulse is used as the power input to an accelerator section.

SUMMARY OF THE INVENTION

The present invention provides method and apparatus for converting electromagnetic pulses to higher power amplitude and shorter duration, in binary multiples. The necessary active components operate on the input, and thus are required to operate at low power levels only. Peak powers in excess of those normally attainable by prior art techniques are therefore possible.

In broad terms, the invention contemplates splitting an input pulse into two channels, and subjecting the pulses in the two channels to a number of binary pulse compression operations. Each pulse compression operation entails combining the pulses in both input channels and selectively steering the combined power to one output channel during the leading half of the pulses and to the other output channel during the trailing half of the pulses, and then delaying the pulse in the first output channel by an amount equal to half the initial pulse duration in order to render the resultant pulses in the two channels coincident for possible subsequent pulse compression operations.

The apparatus for carrying out each of the binary multiplication operations preferably includes a four-port coupler (such as a 3 dB hybrid), which operates on power inputs at a pair of input ports by directing the combined power to either of a pair of output ports, depending on the relative phase of the inputs. Therefore, by appropriately phase coding the pulses prior to any of the pulse compression stages, the entire pulse compression (with associated binary power multiplication) can be carried out solely with passive elements.

The invention is very versatile. As long as the phase coding apparatus can effect 180° phase shifts in a time short compared to the compressed pulse duration, as many pulse compression stages as required can be cascaded. If the application requires a series of equally spaced pulses, a continuous wave input can be used, although the output duty cycle is constrained to discrete values (powers of 2).

A further understanding of the nature and advantages of the present invention can be realized by reference to the remaining portions of the specification and the attached drawings.

BRIEF DESCRIPTION OF THE DRAWINGS

FIG. 1 is a block diagram illustrating a two-stage binary power multiplier according to the present invention;

FIGS. 2A–C illustrate a 3 dB hybrid coupler suitable for use with the invention;

FIG. 3 shows plots of waveguide attenuation as a function of diameter for several frequencies;

FIG. 4 is a plan schematic illustrating a preferred embodiment of the two-stage device using folded delay lines; and FIG. 5 is a block diagram of a radar system utilizing the invention.

DESCRIPTION OF THE PREFERRED EMBODIMENTS

FIG. 1 is a block diagram illustrating a two-stage binary power multiplier 10 according to the present invention. Although the present invention has applicability to electromagnetic pulse compression over a broad range of frequencies, the embodiments to be discussed herein deal with microwave frequencies, and the specific applications deal primarily with particle accelerators and radar. While a two-stage device is illustrated and described, devices with greater numbers of stages are possible, and such expansion will be described.

In broad terms, multiplier 10 includes a front-end 12 and a plurality of pulse compression binary power stages (sometimes referred to simply as "stages"), denoted generally 15. For the two-stage device, there are two such stages, denoted 15(1) and 15(2). The pulse compression stages are serially coupled from front-end 12 to a pair of output terminals 20a and 20b. For consistency of nomenclature, stages 15 may be considered to be numbered in reverse order, with stage 15(1) being the downstream-most stage and stage 15(2), or more generally stage 15(N) for an N-stage device, being the stage coupled to front-end 12.

Front-end 12 receives an electromagnetic ("EM") input, more specifically a radiofrequency ("RF") or microwave power input, splits the power into two channels, impresses suitable phase coding on the electromagnetic wave in the two channels, and provides optional amplification if required. Each of pulse compression stages 15 operates on the pulses in the two channels by halving the duration and doubling the power amplitude of the pulses arriving at the inputs to that stage.

As will be described in greater detail below, each of the stages incorporates a device known as a 3 dB hybrid coupler (often referred to simply as a hybrid). Although the properties of hybrids are well known to those skilled in the art, a brief digression to describe the operation of such devices is appropriate. FIG. 2A is a schematic representation of a 3 dB hybrid 25. Hybrid 25 is a four-port device having two pairs of isolated ports, one pair 27a–b of which may be designated the input ports and the other pair 28a–b of which may be designated the output ports. Hybrid 25 communicates microwave power input flowing into input ports 27a–b to output ports 28a–b in a manner that depends on the relative amplitude and phase of the inputs. The properties of such hybrids are well-known, and the relevant properties may be summarized as follows.

Power flow through the device is denoted schematically by a pair of direct paths and a pair of cross paths. Power at either of the input ports is split equally between the direct path and the cross path; the power in the second direct path undergoes a 180° phase change prior to being recombined with the cross path. Thus, if power is supplied to one of the input ports only, that power is split equally between the output ports, and there is no power at the other input port. If power is supplied to input port 27a, the power at output ports 28a and 28b has a relative phase of 0°. If power is supplied to input port 27b, the power at output port 28a has a relative phase of 0° and that at output port 28b a relative phase of 180°. Therefore, superposition yields the following rules:

(a) If both input ports are supplied with power of equal amplitude and the same phase, the total input power exits output port 28a.

(b) If the two input ports are supplied with power of equal amplitude and opposite phase, the total input power exits output port 28b.

(c) The power exiting either output port has the same phase as that supplied at input port 27a.

(d) If the two output ports are shorted, and power is supplied to input port 27a, the total power exits input port 27b.

FIG. 2B shows a sidewall 3 dB hybrid coupler 29. Basically, the device comprises first and second waveguides 30a and 30b which have a common wall portion formed with an aperture 32 to define a coupling region. Such a device is not, in and of itself, suitable since it introduces a 90° phase shift in each of the cross paths. However, if a pair of additional −90° phase shifts are introduced into the second direct paths, one before the split and one after the recombination, the device conforms to the hybrid representation of FIG. 2A. FIG. 2C is a schematic representation of coupler 29 with the additional phase shifts introduced.

The particular elements for the various stages of power multiplier 10 will now be described with reference once more to FIG. 1. Front-end 12 comprises a hybrid 50, a variable phase shifter 52, a pair of biphase modulators 55a and 55b, and a pair of klystrons 57a and 57b. Hybrid 50 receives an input pulse at one of its input ports only, and thus acts as a power splitter. The power from the first output port is subjected to the operation of phase shifter 52 and biphase modulator 55a prior to amplification by klystron 57a. The power from the second output port is subjected to the operation of biphase modulator 55b prior to amplification by klystron 57b.

The successful operation of the invention depends on the maintenance of precise phase relationships between the pulses arriving at each stage. Absolute phase and common propagation delays have no significance. Therefore, there is no significant loss in generality in considering the inputs to each stage to have zero phase initially, and to measure subsequent phase shifts relative to that. The description will be primarily in terms of phases of 0° and 180°, with a + sign indicating a relative phase of 0° and a − sign indicating a 180° phase shift. Times are measured in units corresponding to the width of the output pulse (at output terminals 20a–b). If the power multiplier is used to increase the peak power into an accelerator section and yield the maximum possible voltage, the compressed pulse length is made equal to the section fill time. That is, the unit of time is made equal to the section fill time. For the two-stage embodiment shown here, the input pulse is considered to have a duration of four time units, and each of biphase modulators 55a–b is capable of inserting (or removing) a 180° phase shift in a time short compared to one time unit. The function of variable phase shifter 52 is to ensure that the outputs of klystrons 57a–b are precisely in phase or 180° out of phase (depending on the state of biphase modulators 55a–b).

The particular phase coding regime that is impressed on the electromagnetic wave in each of the two channels depends on the number of pulse compression stages 15. For the particular two-stage embodiment, biphase modulator, 55a provides 0° phase for the first three time units and 180° phase for the fourth time unit, while biphase modulator 55b provides 0° phase for the first two time units, 180° phase for the third time unit, and 0° phase for the fourth time unit. In shorthand, the respective phase coding may be denoted as [+ + + −] for the first channel and [+ + − +] for the second channel.

Each of pulse compression stages 15 comprises a hybrid 60 and a delay line 62. For convenience, the reference numerals for elements within any of stages 15 will bear the same subscript as that for the stage. The delay of each stage's delay line is equal to one-half the duration of the pulse that is input to that stage from the previous stage, i.e., one time unit for delay line 62(1) and two time units for delay line 62(2).

The respective outputs of klystrons 57a and 57b are coupled to the first and second input ports of hybrid 60(2). Delay line 62(2) is connected between the first output port of hybrid 60(2) and the first input port of hybrid 60(1). Delay line 62(1) is connected between the first output port of hybrid 60(1) and output terminal 20(a). The second output port of hybrid 60(2) is connected to the second input port of first-stage hybrid 60(1); the second output port of hybrid 60(1) is connected to output terminal 20(b).

The basic operation of pulse compression stages 15 is that the two input ports of each stage's hybrid receive simultaneous power inputs that are either in phase or 180° out of phase, whereupon the hybrid acts as a phase-dependent switch that selectively directs the combined power to one or the other of the output ports.

As stated above, the phase coding at the inputs of hybrid 60(2) is [+ + + −] at the first input port and [+ + − +] at the second input port. During the first two time units, the phases of the two inputs are the same ([+ +]), whereupon the combined power exits the first output port as a pulse two units long with a phase coding of [+ +]. During the third and fourth time units, the phase coding is opposite ([+ −] for the first input port and [− +] for the second input port), whereupon the combined power exits the second output port as a pulse two units long with the phase coding [+ −]. Delay line 62(2) delays the power exiting the first output port by two units thereby rendering coincident the pulses arriving at the input ports of first-stage hybrid 60(1).

During the first time unit after arrival at hybrid 60(1), the inputs both have the same phase coding [+] and therefore the combined power is directed to the first output port. During the second time unit, the phase is opposite for the two input ports ([+] and [−]), whereupon the combined power exits the second output port. The one-unit delay imposed by delay line 62(1) renders coincident the two pulses arriving at output terminals 20a and 20b. These pulses may be combined if desired, for example by communicating them to the respective input ports of a hybrid 65, whereupon the total combined power exits the first output port of hybrid 65.

The operation described above is readily extended to more than two stages. A pulse compression (with corresponding power multiplication) of $2^N$ requires an input pulse duration of $2^N$ time units and N stages in tandem, with the $i^{th}$-stage delay line providing a delay of $2^{i-1}$ time units. From the above discussion, it can be seen that front-end 12 and second pulse compression stage 15(2), considered together, can be thought of as a front-end feeding a single pulse compression stage. Thus, the phase coding that is required for an N-stage device can be determined by a process, not unlike mathematical induction, working backward from the first stage to the Nth stage. The front-end provides the inputs to the Nth stage. Each compression stage receives pulses at its two input ports; the pulses at the two input ports are in phase during the first half of the pulses and out of phase during the second half. Moreover, for the first input port of each stage other than the first, the phase coding during the first half is the same as the phase coding for the pulse arriving at the first input port for the stage immediately downstream, and the phase coding during the second half is the same as the coding for the pulse arriving at the second input port of the stage downstream.

Table 1 shows the phase coding for a fourstage binary power multiplier. A vertical line is drawn halfway through each pulse to improve readability. As alluded to above, the phases are all relative.

TABLE 1

| Stage | 4 | 3 | 2 | 1 | 0 |
|---|---|---|---|---|---|
| Input 1 | + + + − + + − + | + + + − − − + − | + + + − \| + + − + | + + \| + − | + \| + | + |
| Input 2 | + + + − + + − + | − − − + + + − + | + + + − \| − − + − | + + \| − + | + \| − | + |

For most applications, output pulses of the same phase are suitable, in which case, the phase coding of Table 1 is sufficiently general. It should be noted, however, that the phase coding represents a special case in that the output pulses at the two output terminals are chosen to have the same phase coding (in this case +). A more general case would be that the two output pulses have phase codings A and B, which may or may not be the same, and may or may not be constant. Table 2 shows the phase codings for a four-stage device, with the notation that a prime indicates a 180° phase shift. In the event that A and B are both the same, the entries on Table 2 reduce essentially to those of Table 1.

TABLE 2

| Stage | 4 | 3 | 2 | 1 | 0 |
|---|---|---|---|---|---|
| Input 1 | ABABABAB | ABABABAB | ABAB \| ABAB | AB \| AB | A \| B | A |
| Input 2 | ABABABAB | ABABABAB | ABAB \| ABAB | AB \| AB | A \| B | B |

In the generalized case, A and B could represent particular phase modulation regimes, repetitively and alternately impressed on the inputs. For example, if A is [+ + + −] and B is [+ + − +], with no additional phase modulation, the outputs could be communicated to additional pulse compression stages.

While the above discussion assumed that the input to the $N^{th}$ stage is a pulse of $2^N$ units duration, a continuous input can be used. So long as the phase coding is appropriate for each $2^N$-unit segment, the output will be a series of pulses with a $2^{-N}$ duty cycle and a power amplitude $2^N$ times that of the amplitude of the continuous wave at the $N^{th}$ stage input ports.

The discussion in terms of power multiplication by a factor $2^N$ is based on the assumption that the losses are zero. Nearly zero dissipation is possible if the delay lines are superconducting or are round guides operating in the $TE_{01}$ circular mode. In general, however, each delay line causes some attenuation, so that the power multiplication factor $M_i$ for the $i^{th}$ stage is not 2, but rather:

$$M_i = 1 + \exp(-2\tau_i), \quad \tau_i = 2^{i-1} T_f \alpha_t \tag{01}$$

where $\tau_i$ is the attenuation of the $i^{th}$ stage delay line in nepers, $T_f$ is the duration of the output pulse, and $\alpha_t$ is the attenuation in nepers per unit time delay. The compression efficiency $\eta_{pc}$ is given by:

$$\eta_{pc} = \frac{M}{2^N} \tag{02}$$

where M is the product of the individual multiplication factors.

At microwave frequencies, the delay lines may be sections of loaded or unloaded waveguide. For either a loaded or an unloaded waveguide, the attenuation in nepers per unit time delay is given by:

$$\alpha_t = \frac{p_d}{2w} \tag{03}$$

where $p_d$ is the power dissipated per unit length, and $w$ is the energy stored per unit length.

Since the attenuation is proportional to the time delay, the attainment of high efficiencies for large compression factors or long compressed pulses requires delay lines having a low attenuation per unit time delay.

Because the attenuation per unit time delay of a smooth line is less than that of a loaded line of the same diameter, a smooth line is generally preferred for the delay lines. The smooth line has the additional advantages that it is easier to manufacture, is easier to cool (especially important if the line is superconducting), has a wider bandwidth and hence better step response, and is characterized by a lower field for a given transmitted power.

The dissipation of delay lines operating in the $TE_{01}$ mode decreases as the frequency increases, and is almost negligible at frequencies above 10,000 MHz with round guides about 3 inches in diameter. The delay lines operating in the $TE_{11}$ circular mode have the smallest diameter for a given frequency. The attenuations for the $TE_{11}$ and $TE_{01}$ modes in round pipes are:

$$TE_{11}: \alpha_t = \frac{R_s c}{a\eta} \left[ \left(\frac{\lambda}{\lambda_c}\right)^2 + 0.419 \right] \tag{04}$$

$$TE_{01}: \alpha_t = \frac{R_s c}{a\eta} \left(\frac{\lambda}{\lambda_c}\right) \tag{05}$$

where $R_s$ is the surface resistance, c is the velocity of light, a is the guide radius, and $\eta$ is the free space impedance.

For a copper pipe, $R_s = 0.0261\sqrt{f}$ and the attenuation in nepers/$\mu$s in a guide of diameter D (cm) operating at a frequency f (MHz) for the indicated modes are:

$$TE_{11}: \alpha_t = \frac{0.0414\sqrt{f}}{D} \left[ \frac{3.09 \times 10^8}{D^2 f^2} + 0.419 \right] \tag{06}$$

$$TE_{01}: \alpha_t = \frac{5.56 \times 10^7}{D^3 f^{3/2}} \tag{07}$$

FIG. 3 shows plots of $\alpha_t$ as a function of diameter for several frequencies. For $\tau \ll 1$, the multiplication factor is $2(1-\tau)$ and the efficiency is $1-\tau$. Since $\tau = \alpha_t T_d$, these plots allow an estimate of the reduction of the multiplication factor and of the efficiency due to attenuation.

However, smooth lines suffer the disadvantage that a 1 microsecond delay line is 300 meters long. This can be shortened by using a loaded line. A $TE_{01}$ loaded line is most suitable because it carries no axial current (and therefore has the lowest attenuation per unit time delay) and is easy to manufacture. At 2856 MHz, for example, a cavity with a diameter of 5.4 inches has $\alpha_t = 0.163$ nepers/$\mu$s whereas a smooth guide of the same diameter, operating in $TE_{11}$ mode has $\alpha_t = 0.1$ nepers/$\mu$s. Thus, a lightly loaded line is generally a good compromise.

In addition to the power lost by delay line dissipation, there is residual power loss because only when the input powers are equal is it possible to adjust their relative phase so that all power exits one output port with zero residual power at the other output port. Fortunately, as shown in Appendix 1, the ratio of residual power to power lost by delay line dissipation is itself proportional to the dissipation loss. Since the delay line loss must be kept low in any case, the reduction of compression efficiency due to residual power loss is insignificant.

The effect of dissipation losses can at least in part be overcome by reducing the amplitude of the input pulse in a stepwise (or continuous) fashion. If the reduction corresponds to the attenuation in the delay lines, the two pulses arriving at each stage will be equal in amplitude.

FIG. 4 is a plan schematic illustrating the configuration of a specific design of pulse compression stages 15(1) and 15(2). The reference numerals are the same as in FIG. 1. The specific design uses folded delay lines in order to overcome the length problem discussed above, and is able to realize a relatively compact configuration. The realization of the folded lines exploits the property of the hybrid that if the two output ports are shorted, the power traveling to the first input port exits the second input port traveling in the opposite direction. This is shown symbolically as heavy curved arrows through the coupling apertures of the hybrids used to effect such reversal of direction. The drawing is somewhat schematic in that the dimensions are not shown exactly, although delay line 62(2) is shown as introducing approximately twice the relative delay of delay line 62(1).

FIG. 5 is a block diagram of a radar system 80 utilizing the binary power multiplication technique of the present invention. Power from an oscillator 82 is divided by a power divider 85 and communicated to a pair of transmitters 87a and 87b through respective biphase modulators 88a and 88b, which impress phase coding on their respective power inputs as appropriate for subsequent pulse compression, to be described below. Basic timing for transmitters 87a–b and biphase modulators 88a–b is established by signals from a clock 89. The power from transmitters 87a and 87b is fed to respective antennas 90a and 90b through respective duplexers 92a and 92b. The echoes, as received at antennas 90a and 90b are coupled by duplexers 92a and 92b to respective receivers 95a and 95b. The receiver outputs, which carry the phase coding impressed by biphase modulators 88a and 88b are communicated through a set of pulse compression stages 100, which provides pulse compression and power multiplication as described in detail above. The output powers from the pulse compression stages are combined at a power combiner 102 and measured or displayed by an appropriate indicator 105.

It is noted that this configuration protects the receiver since the transmitted signal amplitude is low. The radar system has the following advantages over frequency modulated (chirp) radar: it does not require a dispersive structure; the pulse rise time is sharper as there are no side lobes; and there is no residual frequency modulation in the compressed pulse.

As alluded to above, the present invention can be operated in a mode where the input pulse is modulated in phase, amplitude, or frequency during each unit time interval, whereupon the compressed output pulse will be correspondingly modulated. By way of example, radar system 80 may utilize chirp radar as well. In such a case, the signal from oscillator 82 is modulated by a frequency modulator 110, and the signal from power combiner 102 is passed through a dispersive delay line 112. The result is the pulse compression product of the two methods. If the time between the clock pulses equals the duration of the modulation pattern, the transmitted signal is of constant amplitude. The received compressed pulse is delayed from the clock pulse by the duration of the modulation pattern plus the travel time of the signal to the target and back. If a reverse phasing pattern is initiated to undo the phase modulation on the received signal when the compressed pulse arrives, one obtains a continuous wave signal. The difference frequency between this signal and the oscillator signal is representative of the target velocity.

In conclusion, it can be seen that the present invention provides a surprisingly effective way for obtaining short pulses of high power electromagnetic energy. The design is very flexible in that the desired output is readily tailored to the particular application needs by choosing the appropriate number of pulse compression stages. Since the phase coding is done at the input, the upper limits on the power are set by the passive elements.

While the above is a complete description of the preferred embodiments of the invention, alternate constructions, modifications, and equivalents may be used. For example, ideally the delay lines should be superconducting for the compression efficiency to approach 100%, although it is possible to approach this using circular $TE_{01}$ overmoded room temperature copper delay lines and hybrids. Circular $TE_{01}$ mode directional couplers have been developed and are discussed in "Advances in Microwaves," edited by L. Young (Academic Press 1966). Additionally, while the emphasis above is on microwave frequencies, the invention can be implemented in other frequency ranges (such as optical) where hybrids, delay lines, biphase modulators, and amplifiers are available. Therefore, the above description should not be taken as limiting the scope of the invention, which is defined by the appended claims.

Appendix 1—Effect of Unequal Input Powers

Consider the effect when the powers at the two inputs of a hybrid coupler are unequal. With no loss in generality it may be assumed that the power at input 1 is $f_2$ and at input 2 is unity. Also assume that the coupling is c. Superposition may be used to obtain the output powers. If the phase is adjusted for maximum power at output 1, the two output powers $P_{o1}$ and $P_{o2}$ are:

$$P_{o1} = (f\sqrt{1-c^2}+c)^2, \quad P_{o2} = (fc-\sqrt{1-c^2})^2$$

For all power $f^2+1$ to exit output 1 with no power at output 2 requires $$c^2 = \frac{1}{f^2+1}$$

If the phase is adjusted for maximum power at output 2, the two output powers are $$P_{o1} = (f\sqrt{1-c^2}-c)^2, \quad P_{o2} = (fc+\sqrt{1-c^2})^2$$

For all power to exit output 2 with no power at output 1 requires $$c^2 = \frac{f^2}{f^2+1}$$

For equal power inputs, ($f^2=1$), both conditions can be satisfied if $c^2=\frac{1}{2}$; that is, the coupling is 3 dB, and all power exits one output.

With unequal power inputs, there is no value of coupling coefficient that can satisfy both conditions. While it is possible to choose a coupling that causes all power to exit one port only, this coupling will not permit all power to exit the other output. Since the invention ideally requires that all power be directed to either output, it is impossible to adjust the coupling to accommodate unequal power inputs.

Fortunately, the power ratio $f^2$ is close to 1, since the delay line attenuation is required to be low. Therefore, a coupling of 3 dB is very nearly ideal in the sense that the residual power is small compared to the power loss in the delay line, and its effect on compression efficiency is small. For 3 dB coupling, $c^2=\frac{1}{2}$, and the residual power $P_{or}$ at either output is:

$$P_{or} = \left(\frac{f}{\sqrt{2}} - \frac{1}{\sqrt{2}}\right)^2$$

Let the power loss by delay dissipation be $\delta$, so that $f^2 = 1-E$. Substituting $\sqrt{1-E}$ for f gives $$P_{or} = 1 - \frac{\delta}{2} - \sqrt{1-\delta}$$

which, for $\delta << 1$, reduces to $P_{or} = \delta^2/4$. This is to be compared to the power lost by dissipation, which is $\delta$. The ratio of residual power to dissipation power is $\delta/4$. For example, for 1 dB delay line attenuation, the dissipation power $\delta=0.26$, and the residual power is only about 1/16 of the dissipation power.

I claim:

1. Apparatus for converting EM pulses to higher power amplitude and shorter duration, comprising:
    first and second four-port coupler means, each having first and second input ports and first and second output ports, for communicating EM power between said input ports and said output ports as follows:

if the input ports have respective power inputs of equal amplitude and phase, the combined power exits the first output port only, if the input ports have respective power inputs of equal amplitude and opposite phase, the combined power exits the second output port only, and any power exiting either of the output ports has the same phase as the power at the first input port;

said second four-port coupler means having its second output port coupled to said second input port of said first four-port cooupler means;

a first delay means, coupled between said first output port of said first four-port coupler means and an output terminal, for delaying power exiting said first output port of said first four-port coupler means by one time unit;

a second delay means, coupled between said first output port of said second four-port coupler means and said first input port of said first four-port coupler means, for delaying power exiting said first output port of said second four-port coupler means by two time units; and means for supplying respective first and second simultaneous EM pulses to said first and second input ports of said second four-port coupler means, with each of said EM pulses having an amplitude of one-quarter power unit and a duration of four time units;

said means for supplying including associated means for impressing respective phase codings on said first and second EM pulses before supplying said EM pulses to said second four-port coupler means so that said first EM pulses has a first phase coding during a first one-unit interval, a second phase coding during a second one-unit interval, said first phase coding during a third one-unit interval, and a third phase coding opposite to said second phase coding during a fourth one-unit interval, and said second EM pulse has said first phase coding during said first one-unit interval, said second phase coding during said second one-unit interval, a fourth phase coding opposite to said first phase coding during said third one-unit interval, and said second phase coding during said fourth one-unit interval;

whereupon the EM power exiting said first delay means has an amplitude of one power unit, a duration of one time unit, and said first phase coding, while the EM power exiting said second output port of said first four-port coupler means has an amplitude to one power unit, a duration of one time unit, and said second phase coding.

2. The apparatus of claim 1 wherein said second phase coding is the same as said first phase coding.

3. The apparatus of claim 1 wherein the phase coding during each one-unit interval is constant.

4. The apparatus of claim 1, and further comprising: means, associated with said means for supplying, for amplifying said first and second EM pulses.

5. Apparatus for converting EM pulses to higher power amplitude and shorter duration, comprising:

a plurality of N pulse compression stages, each having a unique associated ordinal number in the range of 1 to N inclusive;

for each value of i satisfying $N \geq i \geq 1$, the $i^{th}$ stage comprises a delay element of $2^{i-1}$ units and a four-port coupler having first and second input ports and first and second output ports;

each of the four-port couplers operating on power inputs at its input ports as follows if the input ports have respective power inputs of equal amplitude and phase, the combined power exits the first output port only, if the input ports have respective power inputs of equal amplitude and opposite phase, the combined power exits the second output port only, and any power exiting either of the output ports has the same phase as the power at the first input port;

said stages being serially coupled in order of descending ordinal numbers as follows for each value of i satisfying $N \geq i \geq 1$, the $i^{th}$ stage delay element is coupled between the first output port of the $i^{th}$ stage four-port coupler and the first input port of the $(i-1)^{th}$ stage four-port coupler, the first stage delay element is coupled between the first output port of the first stage four-port coupler and a first output terminal, for each value of i satisfying $N \geq i \geq 1$, the second output port of the $i^{th}$ stage four-port coupler is coupled to the second input port of the $(i-1)^{th}$ stage four-port coupler, and the output port of the first stage four-port coupler is coupled to a second output terminal;

means for supplying first and second substantially simultaneous input pulses to the first and second input ports, respectively, of the four-port coupler of the $N^{th}$ pulse compression stage, each of said first and second input pulses having a duration of $2^N$ units and a power amplitude of $\frac{1}{2}^N$ power unit; and means for impressing respective phase codings on said first and second input pulses before supplying said input pulses to the input ports of the four-port coupler of the Nth pulse compression stage such that each stage receives first and second pulses at the input ports of the four-port coupler for that stage;

for each value of i satisfying $N \geq i \geq 1$, the pulses that are received at the $i^{th}$ stage are $2^i$ units in duration, for each value of i satisfying $N \geq i \geq 1$, during the first half of the pulses that are received at the $i^{th}$ stage, the phase coding of the pulse that is input to the first input port is the same as the coding of the pulse that is input to the second input port, and during the second half of the pulses, the phase coding is opposite, and for each value of i satisfying $N \geq i \geq 1$, during the first half of the pulses that are input to the $i^{th}$ stage, the phase coding of the pulse that is input to the first input port for the $i^{th}$ stage is the same as the phase coding of the pulse that is input to the first input port for the $(i-1)^{th}$ stage, and during the second half of the pulses that are input to the $i^{th}$ stage, the phase coding of the pulse that is input to the first input port of the $i^{th}$ stage is the same as the phase coding of the pulse that is input to the second input port of the $(i-1)^{th}$ stage.

6. A method of converting an EM pulse to higher power amplitude and shorter duration, comprising the steps of:

splitting the pulse into two channels to provide two pulses that are substantially coextensive in time;

impressing respective phase codings on the two pulses;

thereafter subjecting the pulses in the two channels to N pulse compression steps, each pulse compression step comprising the substeps of combining the pulses in both channels and directing the combined power to the first channel during the first half of the pulse duration and to the second channel during the second half of the pulse duration, based on the phase codings impressed prior to said pulse compression steps, and delaying the pulse in the first channel by an amount equal to half the pulse duration so as to render the resultant pulses in both channels substantially coincident;

whereupon each pulse compression step causes the power to be doubled and the pulse length to be halved, so that the result of said N binary multiplication steps is a power increase of $2^N$ and a time compression of $2^N$.

7. The method of claim 6, and further comprising the step, carried out immediately before said subjecting steps, of amplifying the pulses in the two channels.

* * * * *